United States Patent
Tahata et al.

(10) Patent No.: US 9,413,157 B2
(45) Date of Patent: Aug. 9, 2016

(54) DIRECT-CURRENT CIRCUIT BREAKER

(75) Inventors: Kazuyori Tahata, Tokyo (JP); Hiroki Ito, Tokyo (JP); Kunio Kikuchi, Tokyo (JP); Kenji Kamei, Tokyo (JP); Yusaku Horinouchi, Tokyo (JP); Masaki Hiratsuka, Tokyo (JP); Sho Tokoyoda, Tokyo (JP); Toshinobu Takeda, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 29 days.

(21) Appl. No.: 14/383,221

(22) PCT Filed: May 1, 2012

(86) PCT No.: PCT/JP2012/061531
§ 371 (c)(1),
(2), (4) Date: Sep. 5, 2014

(87) PCT Pub. No.: WO2013/164875
PCT Pub. Date: Nov. 7, 2013

(65) Prior Publication Data
US 2015/0043120 A1     Feb. 12, 2015

(51) Int. Cl.
*H01H 33/59*     (2006.01)
*H02H 3/02*     (2006.01)
(Continued)

(52) U.S. Cl.
CPC ............ *H02H 3/021* (2013.01); *H01H 33/596* (2013.01); *H02H 3/087* (2013.01); *H01H 9/56* (2013.01); *H03K 17/13* (2013.01)

(58) Field of Classification Search
USPC .......................................................... 361/13
See application file for complete search history.

(56) References Cited

U.S. PATENT DOCUMENTS 3,925,707 A    12/1975   Bhate et al.
4,056,836 A * 11/1977   Knauer ................ H01H 33/596
                                                                        361/2
(Continued)

FOREIGN PATENT DOCUMENTS

EP           0411663 A2     6/1991
JP          54-140177 A    10/1979
(Continued)

OTHER PUBLICATIONS

International Search Report (PCT/ISA/210) mailed on Jul. 10, 2012, by the Japanese Patent Office as the International Searching Authority for International Application No. PCT/JP2012/061531.
(Continued)

*Primary Examiner* — Ronald W Leja
(74) *Attorney, Agent, or Firm* — Buchanan Ingersoll & Rooney PC (57) ABSTRACT

A direct-current circuit breaker includes a switching unit inserted in the direct-current line; and a commutation circuit that includes a series circuit including a first current-limiting element and an interrupting unit that forms a current zero point by superimposing a resonance current on a direct current flowing in the direct-current line and interrupts the direct current at the current zero point, that is connected in parallel with the switching unit, and that becomes a flow path for the direct current after the switching unit is opened, wherein current interruption is performed by the interrupting unit after the switching unit is opened.

4 Claims, 4 Drawing Sheets

(51) Int. Cl.
*H02H 3/087* (2006.01)
*H03K 17/13* (2006.01)
*H01H 9/56* (2006.01)

(56) References Cited

U.S. PATENT DOCUMENTS

| | | | | |
|---|---|---|---|---|
| 4,110,806 | A * | 8/1978 | Murano | H01F 38/023 |
| | | | | 307/135 |
| 4,245,185 | A * | 1/1981 | Mitchell | H03K 17/292 |
| | | | | 323/235 |
| 4,300,181 | A * | 11/1981 | Premerlani | H02H 7/222 |
| | | | | 361/13 |
| 4,578,730 | A * | 3/1986 | Tokuyama | H01H 33/596 |
| | | | | 307/126 |
| 4,631,621 | A * | 12/1986 | Howell | H01H 9/542 |
| | | | | 361/11 |
| 4,740,858 | A * | 4/1988 | Yamaguchi | H01H 33/596 |
| | | | | 361/3 |
| 5,083,232 | A * | 1/1992 | Bergsjo | H02H 9/023 |
| | | | | 361/11 |
| 5,402,297 | A * | 3/1995 | Ouchi | H01H 33/596 |
| | | | | 361/1 |
| 5,452,170 | A | 9/1995 | Ohde et al. | |
| 8,654,486 | B2 * | 2/2014 | Amato | H02H 9/023 |
| | | | | 361/19 |
| 2008/0043382 | A1 | 2/2008 | Lee et al. | |
| 2015/0043120 | A1 * | 2/2015 | Tahata | H02H 3/087 |
| | | | | 361/93.9 |

FOREIGN PATENT DOCUMENTS

| | | |
|---|---|---|
| JP | 57-015531 A | 1/1982 |
| JP | 58-34525 A | 3/1983 |
| JP | 58-57229 A | 4/1983 |
| JP | 61-13517 A | 1/1986 |
| JP | 62-7738 U | 1/1987 |
| JP | 5-234471 A | 9/1993 |
| JP | 5-266768 A | 10/1993 |
| JP | 6-104112 A | 4/1994 |
| JP | 6-290940 A | 10/1994 |
| JP | 7-282691 A | 10/1995 |
| JP | 9-231877 A | 9/1997 |
| JP | 11-120871 A | 4/1999 |
| JP | 2000-048686 A | 2/2000 |
| JP | 2001-176363 A | 6/2001 |
| JP | 2004-014239 A | 1/2004 |
| JP | 2005-222705 A | 8/2005 |
| JP | 2010-238391 A | 10/2010 |

OTHER PUBLICATIONS

Written Opinion (PCT/ISA/237) mailed on Jul. 10, 2012, by the Japanese Patent Office as the International Searching Authority for International Application No. PCT/JP2012/061531.

Notice of Rejection issued on Nov. 20, 2012 in corresponding JP Application No. 2012-542288, with English translation.

Extended European Search Report issued in European Patent Application No. 12875886.9, mailed Jan. 20, 2016 (7 pages).

* cited by examiner

DIRECT-CURRENT CIRCUIT BREAKER

FIELD

The present invention relates to a direct-current circuit breaker that interrupts high voltage high direct current.

BACKGROUND

In conventional direct-current circuit breakers that interrupt direct current, because, unlike alternating current, direct current does not have a current zero point, a current zero point is formed by superimposing resonance current from a commutation circuit composed of a capacitor and a reactor and the direct current is interrupted at the current zero point. Such methods of forming a current zero point include a forced commutation method (for example, Patent Literature 1) in which a commutation circuit composed of a capacitor and a reactor is connected in parallel with an interrupting unit and the resonance current with the reactor due to the discharge of the charge stored in the capacitor in advance is superimposed on the direct current, thereby forming a current zero point, and a self-commutation method (for example, Patent Literature 2) in which a commutation circuit composed of a capacitor and a reactor is connected in parallel with an interrupting unit and a current zero point is formed by using a self-oscillation phenomenon based on the interaction between an arc and the commutation circuit.

CITATION LIST

Patent Literature

Patent Literature 1: Japanese Patent Application Laid-open No. S58-34525
Patent Literature 2: Japanese Patent Application Laid-open No. S58-57229

SUMMARY

Technical Problem

However, with the conventional technologies described above, in either method, there is a problem in that devices, such as a capacitor, in the commutation circuit increase in size and cost as the current interruption burden becomes severe.

The present invention has been achieved in view of the above and an object of the present invention is to provide a direct-current circuit breaker capable of reducing the current interruption burden and reducing the size and cost of the devices.

Solution to Problem

In order to solve the above problems and achieve the object, a direct-current circuit breaker according to the present invention is a direct-current circuit breaker that includes an interrupting unit that forms a current zero point by superimposing a resonance current on a direct current flowing in a direct-current line and interrupts the direct current at the current zero point, the direct-current circuit breaker including: a switching unit inserted in the direct-current line; and a commutation circuit that includes a series circuit including a first current-limiting element and the interrupting unit and becomes a flow path for the direct current after the switching unit is opened, wherein current interruption is performed by the interrupting unit after the switching unit is opened.

Advantageous Effects of Invention

According to the present invention, an effect is obtained where the current interruption burden of the direct-current circuit breaker can be reduced and the size and cost of the devices can be reduced.

DESCRIPTION OF EMBODIMENTS

A direct-current circuit breaker according to embodiments of the present invention will be explained below in detail with reference to the accompanying drawings. The present invention is not limited to the embodiments described below.

First Embodiment

Figure 1:
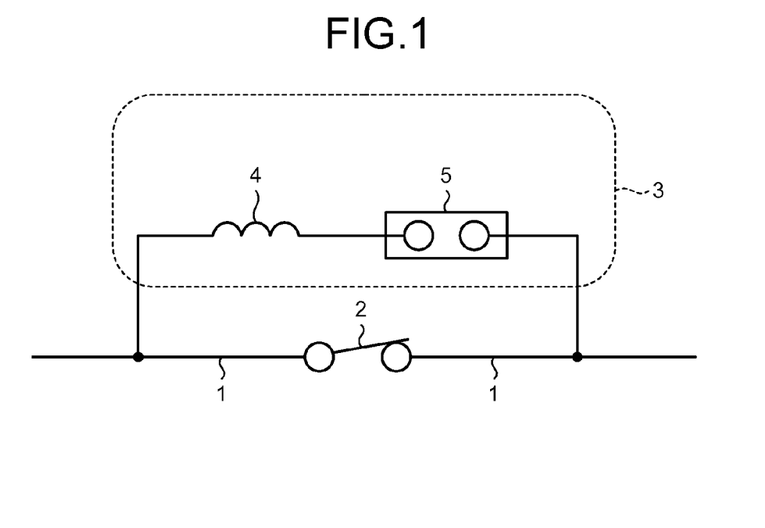
FIG. 1 is a diagram illustrating a configuration example of a direct-current circuit breaker according to a first embodiment.

FIG. 1 is a diagram illustrating a configuration example of a direct-current circuit breaker according to a first embodiment. As illustrated in FIG. 1, the direct-current circuit breaker according to the first embodiment includes a switching unit 2 inserted in a direct-current line 1 and a commutation circuit 3 that is configured by a series circuit including a reactor 4, which is a first current-limiting element, and an interrupting unit 5, that is connected in parallel with the switching unit 2, and that becomes a direct-current flow path after the switching unit 2 is opened. In the present embodiment, the interrupting unit 5 includes a current-zero-point forming unit that uses a self-excited commutation method or a forced commutation method described above and can interrupt direct current. It is assumed that the switching unit 2 can operate at higher speed than the interrupting unit 5 and thus the time until the switching unit 2 is opened upon receiving an opening instruction from a control circuit (not illustrated) is shorter than that in the interrupting unit 5. In a steady state, the switching unit 2 and the interrupting unit 5 are controlled such that they are in a closed state.

Figure 2:
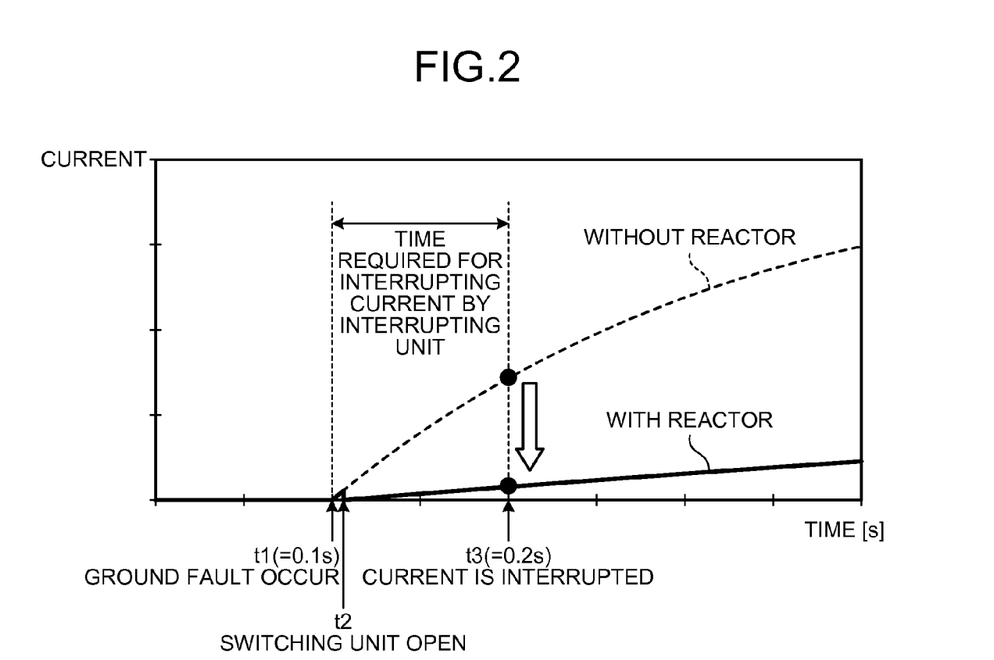
FIG. 2 is a diagram illustrating the behavior of a fault current according to the presence or absence of a reactor in the direct-current circuit breaker according to the first embodiment.

Next, an explanation will be given of an operation when the direct-current circuit breaker according to the first embodiment interrupts direct current with reference to FIG. 1 and FIG. 2. FIG. 2 is a diagram illustrating the behavior of a fault current according to the presence or absence of a reactor in the direct-current circuit breaker according to the first embodiment. In the example illustrated in FIG. 2, an example is illustrated where a failure (in this embodiment, for example, a ground fault on the right end side of the direct-current circuit breaker illustrated in FIG. 1) occurs in the direct-current line 1 at the time t1 (=0.1 s).

As illustrated in FIG. 2, when the ground fault described above occurs in the direct-current line 1 at the time t1 (=0.1 s), a fault current starts to flow in the direct-current line 1.

At this point, when an opening instruction is output to the switching unit 2 and the interrupting unit 5 from the control circuit (not illustrated) and the switching unit 2 is controlled such that it is opened at the time t2, the fault current is commutated to the commutation circuit 3. At this point, when the reactor 4 is present, the value of the fault current flowing in the direct-current line 1 once becomes approximately zero and then the fault current flowing through the commutation circuit 3, i.e., the series circuit including the reactor 4 and the interrupting unit 5, gradually increases (the line indicated by the solid line in FIG. 2).

Thereafter, at the time t3 (=0.2 s), the current is interrupted by the interrupting unit 5, whereby interruption of the fault current is completed.

When the reactor 4 is not present, the fault current rises sharply from the point at which the ground fault occurs at the time t1 (=0.1 s) (the line indicated by the broken line in FIG. 2) compared with the case where the reactor 4 is present. In the present embodiment, the rise of the fault current can be delayed due to the inductance of the reactor 4; therefore, the fault-current instantaneous value at the fault-current interruption time t3 (=0.2 s) is reduced compared with the case where the reactor 4 is not present. Thus, the current interruption burden of the interrupting unit 5 can be reduced. Overvoltage that occurs between the electrodes of the interrupting unit 5 after the current interruption can be absorbed, for example, by connecting a surge absorber in parallel with the interrupting unit 5.

As described above, the direct-current circuit breaker according to the first embodiment includes a switching unit that is inserted in the direct-current line and becomes a flow path for direct current in a steady state, and a commutation circuit that includes a reactor and an interrupting unit, that is connected in parallel with the switching unit, and that becomes a flow path for direct current after the switching unit is opened, wherein current interruption is performed by the interrupting unit after the switching unit is opened. Therefore, the instantaneous value of the current that flows in the interrupting unit at the current interruption time is reduced, enabling the current interruption burden of the interruption unit to be reduced. Accordingly, devices, such as a capacitor from which the interrupting unit is configured, can be reduced in size. Therefore, the direct-current circuit breaker can be reduced in size and cost.

It is sufficient that the timing at which an opening instruction is output to the switching unit and the interrupting unit is the timing at which the interrupting unit is opened after the switching unit is opened, and it is obvious that the present invention is not limited by the timing at which an opening instruction is output to the switching unit and the interrupting unit.

Moreover, in the first embodiment described above, an explanation is given of an example where overvoltage that occurs between both ends of the interrupting unit after the current interruption is absorbed by a surge absorber; however, the configuration may be such that a surge absorber is not provided depending on the breakdown voltage of the interrupting unit and other circuit conditions.

Second Embodiment

Figure 3:
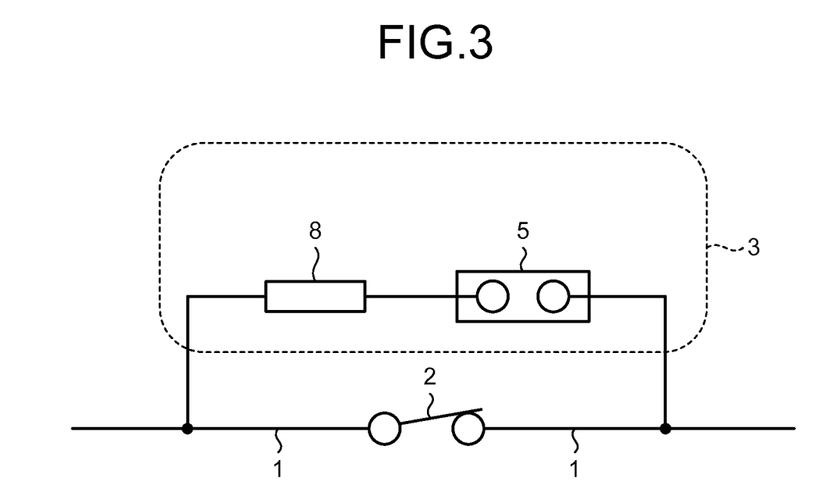
FIG. 3 is a diagram illustrating a configuration example of a direct-current circuit breaker according to a second embodiment.

FIG. 3 is a diagram illustrating a configuration example of a direct-current circuit breaker according to a second embodiment. Components identical or equivalent to those of the first embodiment are denoted by the same reference symbols and explanations thereof will be omitted.

In the present embodiment, as illustrated in FIG. 3, the configuration is such that a saturable reactor 8 is inserted as the first current-limiting element instead of the reactor 4 explained in the first embodiment.

In a steady state, the saturable reactor 8 is saturated such that it enters a low-impedance state. When a fault occurs in the direct-current line 1, after the switching unit 2 is controlled such that it is opened, the saturable reactor 8 is controlled such that it is in an unsaturated state and thus enters a high-impedance state. Accordingly, when a fault current is commutated to the commutation circuit 3, the saturable reactor 8 is in a low-impedance state; therefore, it is possible to reduce the burden when the switching unit 2 is opened. Therefore, the fault current can be easily commutated to the commutation circuit 3. Moreover, after the switching unit 2 is controlled such that it is opened, that is, after the fault current is commutated to the commutation circuit 3, the saturable reactor 8 is caused to enter a high-impedance state. Thus, in a similar manner to the first embodiment, the current interruption burden of the interrupting unit 5 can be reduced.

As described above, according to the direct-current circuit breaker in the second embodiment, the saturable reactor is inserted as the first current-limiting element and, in a steady state, the saturable reactor is saturated such that it enters a low-impedance state. Therefore, when the fault current is commutated to the commutation circuit, it is possible to reduce the burden when the switching unit is opened and thus the fault current can be easily commutated to the commutation circuit.

Moreover, after the fault current is commutated to the commutation circuit, the saturable reactor, which is the first current-limiting element, is caused to enter a high-impedance state; therefore, the fault-current instantaneous value at the fault-current interruption time is reduced. Therefore, in a similar manner to the first embodiment, the current interruption burden of the interrupting unit can be reduced. Accordingly, devices, such as a capacitor from which the interrupting unit is configured, can be reduced in size. Therefore, the direct-current circuit breaker can be reduced in size and cost.

In the second embodiment described above, an explanation is given of an example where the saturable reactor is inserted as the first current-limiting element instead of the reactor explained in the first embodiment; however, it is obvious that the same effects can be obtained as long as the first current-limiting element is an element capable of controlling the impedance as described above.

Third Embodiment

Figure 4:
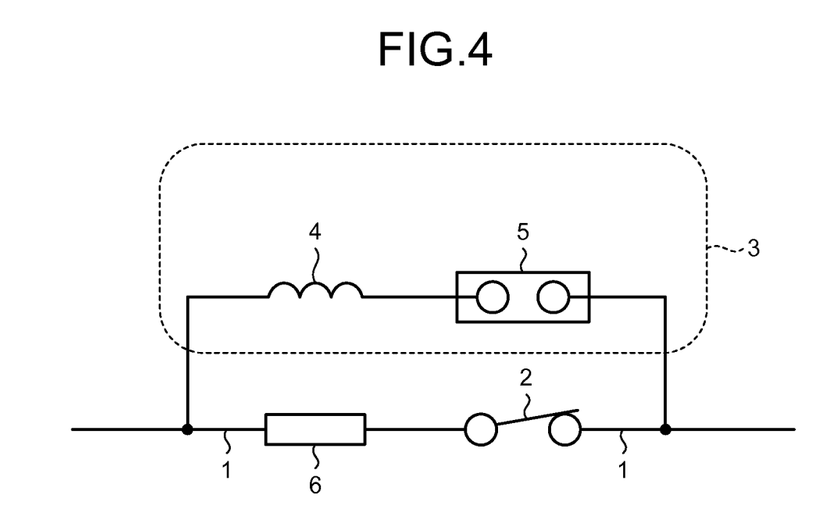
FIG. 4 is a diagram illustrating a configuration example of a direct-current circuit breaker according to a third embodiment.

FIG. 4 is a diagram illustrating a configuration example of a direct-current circuit breaker according to a third embodiment. Components identical or equivalent to those of the first embodiment are denoted by the same reference symbols and explanations thereof will be omitted.

In the present embodiment, as illustrated in FIG. 4, the configuration is such that a second current-limiting element 6 is inserted in series with the switching unit 2 explained in the first embodiment in the direct-current line 1.

It is assumed in the present embodiment that the second current-limiting element 6 is an element in which the impedance becomes approximately zero in a steady state (for example, when the direct current value is about 2000 A) and the impedance increases when the fault current (for example, 50 kA or larger) at the time of the occurrence of a fault is about to flow, for example, a superconducting fault current limiter that instantaneously transitions from the superconducting state to the normal conducting state when overcurrent flows.

With such a configuration, the fault current that flows in the switching unit 2 when a fault occurs is instantaneously suppressed; therefore, it is possible to reduce the burden when the switching unit 2 is opened. Therefore, the fault current can be easily commutated to the commutation circuit 3. Moreover, after the fault current is commutated to the commutation circuit 3, in a similar manner to the first embodiment, the fault-current instantaneous value at the fault-current interruption time is reduced due to the action of the reactor 4, which is the first current-limiting element; therefore, the current interruption burden of the interrupting unit 5 can be reduced.

As described above, the direct-current circuit breaker according to the third embodiment is configured such that the second current-limiting element, in which the impedance becomes approximately zero in a steady state and the impedance increases when the fault current at the time of the occurrence of a fault is about to flow, is inserted in series with the switching unit in the direct-current line. Therefore, the fault current that flows in the switching unit when a fault occurs is instantaneously suppressed. Accordingly, in a similar manner to the second embodiment, the burden when the switching unit is opened can be reduced. Therefore, the fault current can be easily commutated to the commutation circuit.

Moreover, in a similar manner to the first embodiment, after the fault current is commutated to the commutation circuit, the fault-current instantaneous value at the fault-current interruption time is reduced due to the action of the reactor, which is the first current-limiting element; therefore, the current interruption burden of the interrupting unit can be reduced. Accordingly, devices, such as a capacitor from which the interrupting unit is configured, can be reduced in size. Therefore, the direct-current circuit breaker can be reduced in size and cost.

The configuration in the third embodiment can be applied to the configuration in the second embodiment. The configuration may be such that the commutation circuit is configured by connecting the saturable reactor, which is the first current-limiting element, and the interrupting unit in series, and the second current-limiting element and the switching unit are connected in series. With this configuration, the fault current can be further easily commutated to the commutation circuit 3.

Fourth Embodiment

Figure 5:
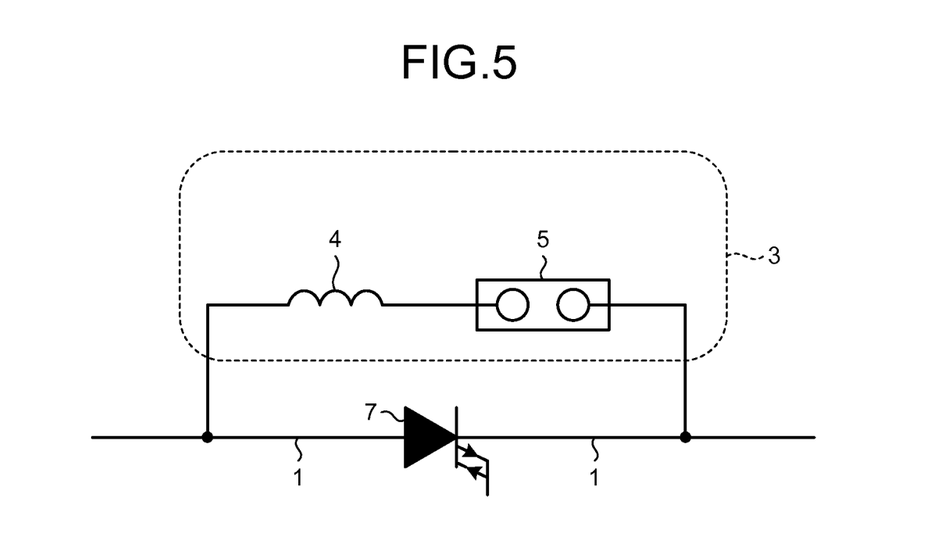
FIG. 5 is a diagram illustrating a configuration example of a direct-current circuit breaker according to a fourth embodiment.

FIG. 5 is a diagram illustrating a configuration example of a direct-current circuit breaker according to a fourth embodiment. Components identical or equivalent to those of the first embodiment are denoted by the same reference symbols and explanations thereof will be omitted.

In the present embodiment, as illustrated in FIG. 5, the configuration is such that a GTO (Gate Turn-off thyristor) 7 is used as the switching unit 2. By using a semiconductor switching element such as the GTO 7, the semiconductor switching element is controlled such that it is definitely turned off before the current interruption time at which current is interrupted by the interrupting unit 5. Therefore, the fault current can be commutated to the commutation circuit 3.

The GTO 7 is controlled such that it is turned on in a steady state and is turned off when a fault occurs in the direct-current line 1, thereby commutating the fault current to the commutation circuit 3. After the fault current is commutated to the commutation circuit 3, in a similar manner to the first to third embodiments, the fault-current instantaneous value at the fault-current interruption time is reduced due to the action of the first current-limiting element; therefore, the current interruption burden of the interrupting unit 5 can be reduced.

The example in FIG. 5 illustrates the configuration in which the GTO 7 is used as the switching unit 2; however, for example, the configuration may be such that a semiconductor switching element such as an IGBT (Insulated Gate Bipolar Transistor) is used, and it is obvious that the same effects can be obtained.

As described above, the direct-current circuit breaker according to the fourth embodiment is configured such that a semiconductor switching element, such as a GTO and an IGBT, is used as the switching unit; therefore, the fault current can be definitely commutated to the commutation circuit before the current interruption time at which current is interrupted by the interrupting unit.

In the fourth embodiment described above, an explanation is given of an example where a semiconductor switching element is used as the switching unit explained in the first embodiment; however, the configuration in the fourth embodiment can be applied to the configurations in the second and third embodiments and it is obvious that the same effects as those in the above embodiments can be obtained.

Fifth Embodiment

Figure 6:
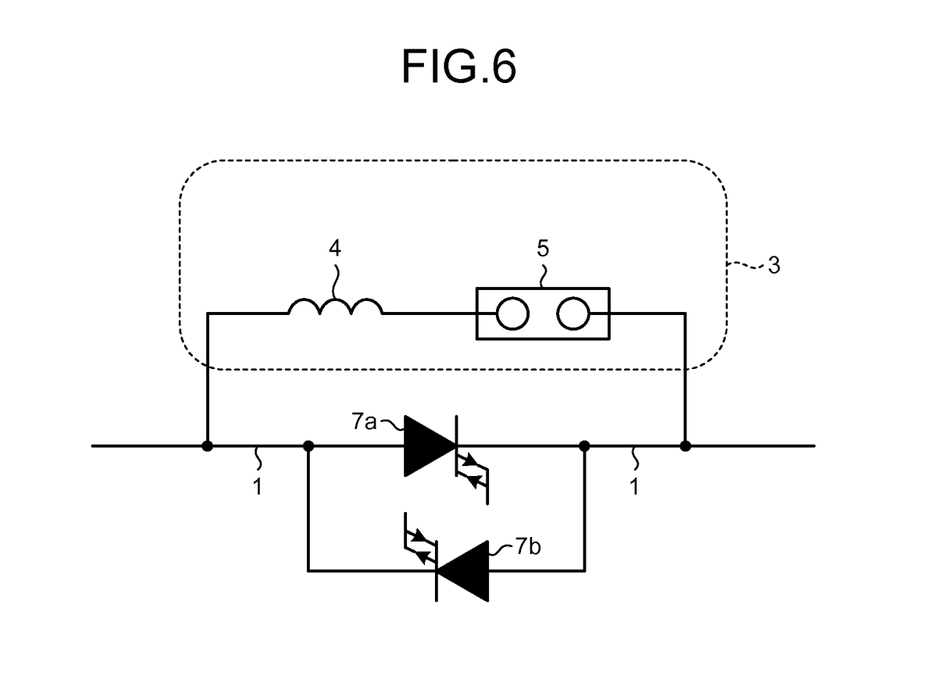
FIG. 6 is a diagram illustrating a configuration example of a direct-current circuit breaker according to a fifth embodiment.

FIG. 6 is a diagram illustrating a configuration example of a direct-current circuit breaker according to a fifth embodiment. Components identical or equivalent to those of the fourth embodiment are denoted by the same reference symbols and explanations thereof will be omitted.

In the configuration in the fourth embodiment, it is assumed that direct current flows from the left end side to the right end side; however, in the present embodiment, as illustrated in FIG. 6, the configuration is such that GTOs 7a and 7b are connected in anti-parallel as the switching unit 2 so as to enable bidirectional conduction.

The GTOs 7a and 7b are controlled such that they are turned on in a steady state and are turned off when a fault occurs in the direct-current line 1, thereby commutating the fault current to the commutation circuit 3. After the fault current is commutated to the commutation circuit 3, in a similar manner to the first to fourth embodiments, the fault-current instantaneous value at the fault-current interruption time is reduced due to the action of the first current-limiting element; therefore, the current interruption burden of the interrupting unit 5 can be reduced.

The example in FIG. 6 illustrates a configuration in which the GTOs 7a and 7b are used as the switching unit 2; however, in a similar manner to the fourth embodiment, for example, the configuration may be such that semiconductor switching elements such as IGBTs are used, and it is obvious that the same effects can be obtained.

As described above, the direct-current circuit breaker according to the fifth embodiment is configured such that semiconductor switching elements, such as GTOs and IGBTs, are connected in anti-parallel as the switching unit; therefore, the fault current can be definitely commutated to the commutation circuit before the current interruption time at which current is interrupted by the interrupting unit regardless of the conduction direction.

In the fifth embodiment described above, an explanation is given of an example where the switching unit is configured by connecting the semiconductor switching elements explained in the fourth embodiment in anti-parallel; however, the configuration in the fifth embodiment can be applied to the configurations in the first to third embodiments and it is obvious that the same effect as those in the above embodiments can be obtained.

Sixth Embodiment

Figure 7:
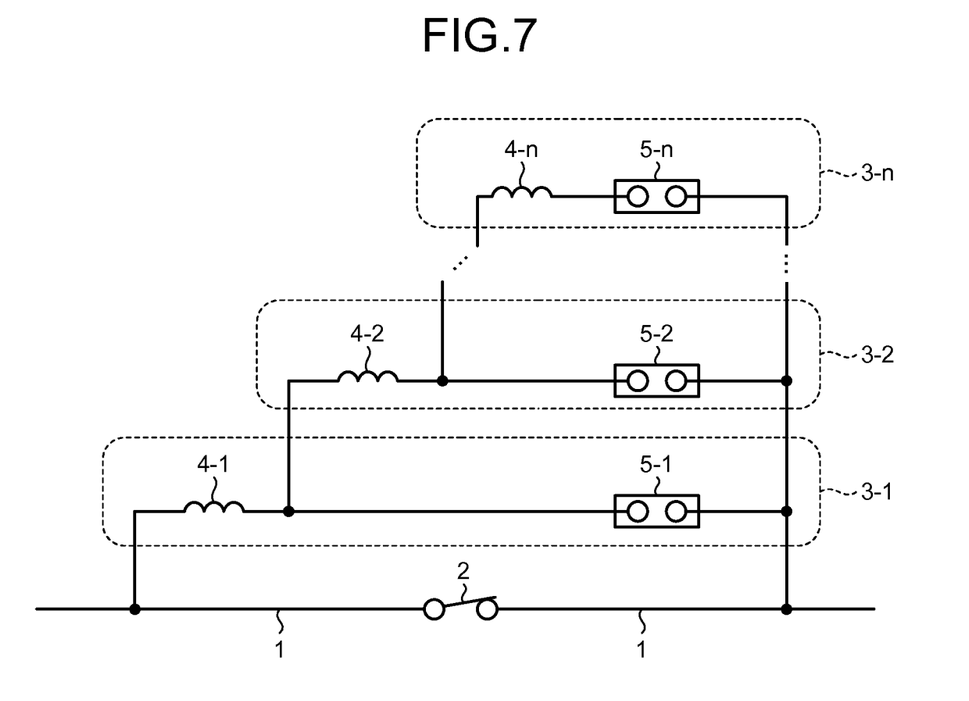
FIG. 7 is a diagram illustrating a configuration example of a direct-current circuit breaker according to a sixth embodiment.

FIG. 7 is a diagram illustrating a configuration example of a direct-current circuit breaker according to a sixth embodiment. In the present embodiment, the direct-current circuit breaker is configured such that commutation circuits 3-1 to 3-$n$ composed of n series circuits, each including a corresponding one of reactors 4-1 to 4-$n$ and a corresponding one of interrupting units 5-1 to 5-$n$, are provided and the commutation circuits 3-1 to 3-$n$ are connected in parallel such that each of the commutation circuits 3-1 to 3-$n$ corresponds to the switching unit 2 and a corresponding one of the interrupting units 5-1 to 5-$n$.

In the direct-current circuit breaker according to the present embodiment, when a fault occurs in the direct-current line 1, after the switching unit 2 is opened, current interruption is performed in the following order: the interrupting units 5-1, 5-2, ..., and 5-$n$. Accordingly, the fault-current instantaneous value at the fault-current interruption time at which current is interrupted by each of the interrupting units 5-1 to 5-$n$ can be suppressed to a low value; therefore, the current interruption burden of each of the interrupting units 5-1 to 5-$n$ can be reduced.

First, the switching unit 2 is opened and the fault current is commutated to the commutation circuits 3-1 to 3-$n$. Therefore, the fault current is divided between the interrupting units 5-1 to 5-$n$ depending on the addition of the impedance of each of the reactors 4-1 to 4-$n$. In other words, the fault current that flows in the interrupting unit 5-1 flows only through the reactor 4-1 and is therefore the largest, and the fault current that flows in the interrupting unit 5-$n$ flows through the reactors 4-1 to 4-$n$ and is therefore the smallest.

Next, when the current is interrupted by the interrupting unit 5-1, the fault current is commutated to the commutation circuits 3-2 to 3-$n$ and the fault current is divided between the interrupting units 5-2 to 5-$n$. Accordingly, the fault current that flows in each of the interrupting units 5-2 to 5-$n$ increases due to the reduction in the number of divisions of the fault current. However, the fault current that flows in the interrupting unit 5-2 flows through the reactors 4-1 and 4-2; therefore, the increment of the fault current due to the reduction in the number of divisions is offset. Therefore, the increase of the fault-current instantaneous value when the current is interrupted by the interrupting unit 5-2 is suppressed to a low value. Thereafter, interruption of the fault current is completed by performing current interruption sequentially by the interrupting units 5-3, 5-4, ..., and 5-$n$.

By current interruption sequentially being performed by the interrupting units 5-1 to 5-$n$ by the method described above, the fault-current instantaneous value when the current is interrupted by each of the interrupting units 5-1 to 5-$n$ can be suppressed to a low value; therefore, the current interruption burden of each of the interrupting units 5-1 to 5-$n$ can be reduced. Moreover, the fault current is commutated to a plurality of the commutation circuits 3-1 to 3-$n$ from the switching unit 2; therefore, the fault current can be more easily commutated to the commutation circuits 3-1 to 3-$n$ from the switching unit 2.

As described above, the direct-current circuit breaker according to the sixth embodiment includes a plurality of commutation circuits, each including a series circuit that includes a reactor and an interrupting unit, and is configured by connecting the commutation circuits in parallel such that each of the commutation circuits corresponds to the switching unit and a corresponding one of the interrupting units. Accordingly, the fault current is commutated to a plurality of the commutation circuits from the switching unit and thus the fault current can be more easily commutated to the commutation circuit from the switching unit.

Moreover, current interruption is performed sequentially starting from the interrupting unit that is connected in series with the least number of reactors. Accordingly the fault-current instantaneous value at the current interruption time at which current is interrupted by each interrupting unit can be suppressed to a low value; therefore, the current interruption burden of each interrupting unit can be reduced.

In the sixth embodiment described above, an explanation is given of a configuration example in which a plurality of the commutation circuits, each including a series circuit that includes a reactor and an interrupting unit, explained in the first embodiment are included; however, the configuration in the sixth embodiment can be applied to the configurations in the second to fifth embodiments and it is obvious that the same effect as those in the above embodiments can be obtained.

Moreover, the configurations illustrated in the above embodiments are examples of the configuration of the present invention and it is obvious that the configurations can be combined with other publicly known technologies and the configurations can be changed, for example, by omitting a part thereof without departing from the scope of the present invention.

REFERENCE SIGNS LIST 1 direct-current line
2 switching unit
3, 3-1, 3-2, ..., 3-$n$ commutation circuit
4, 4-1, 4-2, ..., 4-$n$ reactor (first current-limiting element)
5, 5-1, 5-2, ..., 5-$n$ interrupting unit
6 second current-limiting element
7 GTO (semiconductor switching element)
8 saturable reactor (first current-limiting element)

The invention claimed is:

1. A direct-current circuit breaker that includes an interrupting unit that forms a current zero point by superimposing a resonance current on a direct current flowing in a direct-current line and interrupts the direct current at the current zero point, the direct-current circuit breaker comprising:
a switching unit inserted in the direct-current line;
a commutation circuit that includes a series circuit including a first current-limiting element, which is a reactor, and the interrupting unit and becomes a flow path for the direct current after the switching unit is opened, and
a second current-limiting element which is inserted in series with the switching unit in the direct-current line, in which an impedance becomes approximately zero in a steady state, and in which an impedance instantaneously increases when overcurrent flows,
wherein the second current-limiting element and the switching unit are parallel to the first current-limiting element and the interrupting unit, wherein current interruption is performed by the interrupting unit after the switching unit is opened, wherein the first current-limiting element is a saturable reactor and is controlled such that it changes to a high-impedance state from a low-impedance state immediately after the switching unit is opened and the direct current is commutated to the commutation circuit, and wherein the switching unit is a semiconductor switching element.

2. The direct-current circuit breaker according to claim 1, wherein the second current-limiting element is a superconducting fault current limiter that instantaneously transitions from a superconducting state to a normal conducting state when overcurrent flows.

3. The direct-current circuit breaker according to claim 1, wherein the switching unit is configured by connecting semiconductor switching elements in anti-parallel.

4. The direct-current circuit breaker according to claim 1, comprising a plurality of the commutation circuits, each including a series circuit that includes the first current-limiting element and the interrupting unit, the commutation circuits are connected in parallel such that each of the commutation circuits corresponds to the switching unit and a corresponding one of the interrupting units, and current interruption is performed sequentially starting from the interrupting unit that is connected in series with a least number of the first current-limiting elements.

* * * * *